(12) United States Patent
Tsutsumi et al.

(10) Patent No.: US 12,482,770 B2
(45) Date of Patent: Nov. 25, 2025

(54) SEMICONDUCTOR DEVICE AND METHOD OF MAKING SEMICONDUCTOR DEVICE

(71) Applicant: SUMITOMO ELECTRIC DEVICE INNOVATIONS, INC., Kanagawa (JP)

(72) Inventors: Yuya Tsutsumi, Kanagawa (JP); Masaomi Emori, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 450 days.

(21) Appl. No.: 18/179,639

(22) Filed: Mar. 7, 2023

(65) Prior Publication Data

US 2023/0411319 A1 Dec. 21, 2023

(30) Foreign Application Priority Data

Jun. 21, 2022 (JP) .................. 2022-099360

(51) Int. Cl.
*H01L 23/00* (2006.01)
*H01L 21/768* (2006.01)

(52) U.S. Cl.
CPC .............. *H01L 24/05* (2013.01); *H01L 24/03* (2013.01); *H01L 24/29* (2013.01); *H01L 24/32* (2013.01); *H01L 21/76898* (2013.01); *H01L 2224/0345* (2013.01); *H01L 2224/03462* (2013.01); *H01L 2224/05009* (2013.01); *H01L 2224/05017* (2013.01); *H01L 2224/05018* (2013.01);
(Continued)

(58) Field of Classification Search
CPC ......... H01L 24/05; H01L 24/03; H01L 24/29; H01L 24/32; H01L 21/76898; H01L 2224/0345; H01L 2224/03462; H01L 2224/05009; H01L 2224/05017; H01L 2224/05018; H01L 2224/05083; H01L 2224/05144; H01L 2224/05147; H01L 2224/05155; H01L 2224/05171; H01L 2224/05541; H01L 2224/05557; H01L 2224/05562; H01L 2224/05572; H01L 2224/05647; H01L 2224/29139; H01L 2224/32225; H01L 2924/0132; H01L 2924/10272; H01L 2924/13064; H01L 23/3677; H01L 21/4814; H10D 30/475; H10D 62/8503; H10D 64/254; H10D 30/015; H10D 64/251
See application file for complete search history.

(56) References Cited

U.S. PATENT DOCUMENTS 4,254,431 A 3/1981 Babuka et al.
6,607,650 B1 8/2003 Niuya et al.
(Continued)

FOREIGN PATENT DOCUMENTS

JP 2009-289935 12/2009
JP 2019-145546 8/2019
(Continued)

*Primary Examiner* — Fernando L Toledo
*Assistant Examiner* — Shawn Shaw Muslim
(74) *Attorney, Agent, or Firm* — IPUSA, PLLC

(57) ABSTRACT

A semiconductor device includes a substrate having a first main surface and a second main surface opposite to the first main surface, and a first conductive layer covering the second main surface and including dendrites, wherein a via hole extending through the substrate and having an inner wall surface is formed in the substrate, and wherein the first conductive layer covers the inner wall surface.

14 Claims, 12 Drawing Sheets

(52) U.S. Cl.
CPC ............... *H01L 2224/05083* (2013.01); *H01L 2224/05144* (2013.01); *H01L 2224/05147* (2013.01); *H01L 2224/05155* (2013.01); *H01L 2224/05171* (2013.01); *H01L 2224/05541* (2013.01); *H01L 2224/05557* (2013.01); *H01L 2224/05562* (2013.01); *H01L 2224/05572* (2013.01); *H01L 2224/05647* (2013.01); *H01L 2224/29139* (2013.01); *H01L 2224/32225* (2013.01); *H01L 2924/0132* (2013.01); *H01L 2924/10272* (2013.01); *H01L 2924/13064* (2013.01)

(56) References Cited

U.S. PATENT DOCUMENTS

| | | |
|---|---|---|
| 2011/0084341 A1 | 4/2011 | Kosaka |
| 2014/0021633 A1* | 1/2014 | Lee .................... H01L 21/2885 257/774 |
| 2019/0259662 A1 | 8/2019 | Kosaka et al. |
| 2020/0035551 A1 | 1/2020 | Kosaka et al. |
| 2020/0279818 A1* | 9/2020 | Akiyama ............. H10D 62/124 |
| 2020/0312752 A1 | 10/2020 | Hishiki et al. |

FOREIGN PATENT DOCUMENTS

| | | |
|---|---|---|
| JP | 2020-017647 | 1/2020 |
| JP | 2020-161564 | 10/2020 |
| WO | 2001/007687 | 2/2001 |

\* cited by examiner

SEMICONDUCTOR DEVICE AND METHOD OF MAKING SEMICONDUCTOR DEVICE

TECHNICAL FIELD

The present disclosure relates to semiconductor devices and methods of making a semiconductor device.

The present application is based on and claims priority to Japanese patent application No. 2022-099360 filed on Jun. 21, 2022, with the Japanese Patent Office, the entire contents of which are hereby incorporated by reference.

BACKGROUND

Japanese Laid-Open Patent Publication No. 2019-145546 and Japanese Laid-Open Patent Publication No. 2020-17647, for example, disclose a semiconductor device in which a conductive layer connected to the source electrode of a field effect transistor is formed on an upper surface of an epitaxial substrate, which has a via hole extending therethrough to reach the conductive layer, and a gold plating layer is formed on the lower surface of the epitaxial substrate to be connected to the conductive layer through the via hole.

RELATED-ART DOCUMENT

[Patent Document 1] International Publication No. 01/07687

SUMMARY

According to at least one embodiment, a semiconductor device includes a substrate having a first main surface and a second main surface opposite to the first main surface, and a first conductive layer covering the second main surface and including dendrites, wherein a via hole extending through the substrate and having an inner wall surface is formed in the substrate, and wherein the first conductive layer covers the inner wall surface.

DETAILED DESCRIPTION

Figure 1:
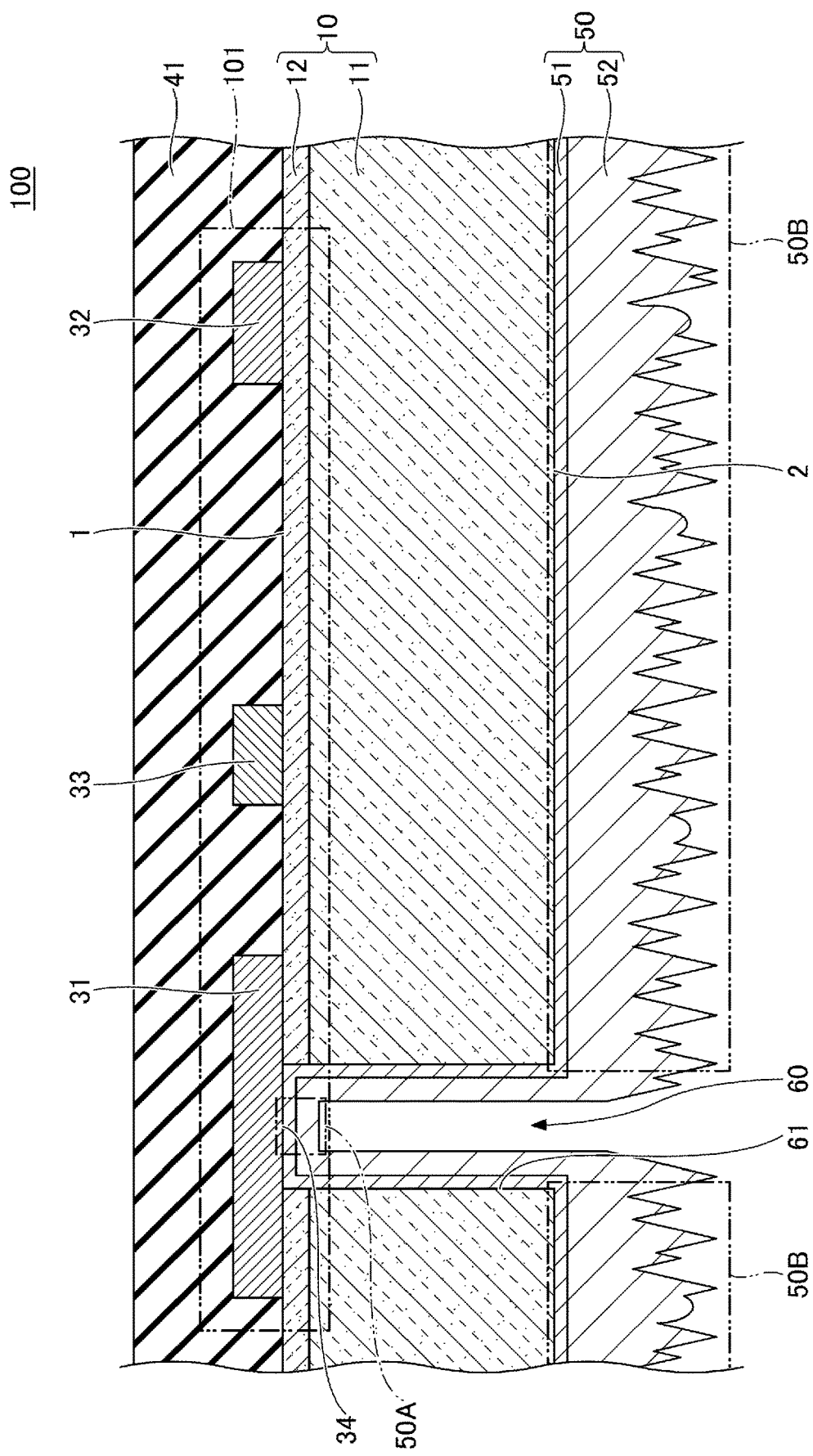
FIG. 1 is a cross-sectional view illustrating a semiconductor device according to an embodiment.

Reduction of material cost may be achieved by using a material less expensive than gold for the plating layer. However, the use of a material less expensive than gold may create a risk of decreased heat dissipation.

It is an object of the present disclosure to provide a semiconductor device and a method of making a semiconductor device that can reduce the decrease of heat dissipation even when reducing material cost.

According to the present disclosure, it is possible to reduce the decrease of heat dissipation even when reducing material cost.

DESCRIPTION OF EMBODIMENTS OF THE PRESENT DISCLOSURE

In the following, embodiments of the present disclosure will be listed and described.

[1] A semiconductor device according to one aspect of the present disclosure includes: a substrate having a first main surface and a second main surface opposite to the first main surface; and a first conductive layer covering the second main surface and including dendrites, wherein the substrate has a via hole extending therethrough and having an inner wall surface, and the first conductive layer covers the inner wall surface.

Since the first conductive layer covers the second main surface and includes dendrites, a large contact area is secured between the first conductive layer and a bonding material when the semiconductor device is mounted on a mounting substrate via the bonding material. This arrangement enables easy transfer of heat from the first conductive layer to the bonding material. As a result, it is possible to reduce the decrease of heat dissipation even when a material less expensive than gold is used for the first conductive layer to reduce the material cost. In addition, the provision of a large contact area ensures excellent bonding strength between the first conductive layer and the mounting substrate.

[2] In the configuration recited in [1], the semiconductor device may further include a second conductive layer disposed on the first main surface and having a first surface that closes an end of the via hole, and the first conductive layer directly cover the first surface. This arrangement allows an electric potential to be applied to the second conductive layer through the first conductive layer.

[3] In the configuration recited in [2], an average thickness of a first portion of the first conductive layer, the first portion covering the first surface, may be greater than or equal to 0.2 μm. This arrangement allows an electric potential to be more stably applied to the second conductive layer through the first conductive layer.

[4] In the configuration recited in [3], the second main surface may include a central region and a closed-loop peripheral region situated around the central region and having a constant width, wherein the width of the closed-loop peripheral region may be less than or equal to 40 µm, and an average thickness of a second portion of the first conductive layer, the second portion covering the second main surface in the central region, may be greater than the average thickness of the first portion. That portion of the first conductive layer which covers the second main surface is preferably thicker than the first portion in order to ensure stable supply of an electric potential to the second conductive layer through the first conductive layer. However, even when the portion of the first conductive layer covering the second main surface is thicker than the first portion, it may be difficult to ensure stable supply of an electric potential if the central region of the first conductive layer is thin. With the average thickness of the second portion being greater than the average thickness of the first portion, stable supply of potential is easily realized.

[5] In the configuration recited in [4], an arithmetic average roughness of the second portion may be greater than or equal to 1.5 µm. This arrangement readily reduces the decrease of heat dissipation, and readily provides excellent bonding strength between the first conductive layer and the mounting substrate.

[6] In the configuration recited in [4] or [5], the arithmetic average roughness of the second portion may be greater than or equal to five times the arithmetic average roughness of the first portion. This arrangement readily reduces the decrease of heat dissipation, and readily provides excellent bonding strength between the first conductive layer and the mounting substrate.

[7] Any one of the configurations recited in [2] through [6] may further include a transistor including a source electrode connected to the second conductive layer. This arrangement allows an electric potential such as a ground potential to be applied to the source electrode through the first conductive layer and the second conductive layer.

[8] In any one of the configurations recited in [1] through [7], the first conductive layer may contain copper. This arrangement readily reduces the material cost.

[9] In any one of the configurations recited in [1] through [8], the substrate may include both a silicon carbide substrate forming the second main surface and a semiconductor layer disposed on the silicon carbide substrate and forming the first main surface. This arrangement readily provides an excellent withstand voltage.

[10] Any one of the configurations recited in [1] through [9] may further include: a mounting substrate including a third conductive layer; and a bonding material that bonds the first conductive layer to the third conductive layer. This arrangement allows heat to be transferred from the first conductive layer to the third conductive layer.

[11] A method of making a semiconductor device according to one aspect of the present disclosure includes: forming, in a substrate having a first main surface and a second main surface opposite to the first main surface, a via hole extending through the substrate and having an inner wall surface; and forming a first conductive layer covering the second main surface and the inner wall surface, the first conductive layer including dendrites.

Since the first conductive layer covers the second main surface and includes dendrites, a large contact area is secured between the first conductive layer and a bonding material when the semiconductor device is mounted on a mounting substrate via the bonding material. This arrangement enables easy transfer of heat from the first conductive layer to the bonding material. As a result, it is possible to reduce the decrease of heat dissipation even when a material less expensive than gold is used for the first conductive layer to reduce the material cost. In addition, the provision of a large contact area ensures excellent bonding strength between the first conductive layer and the mounting substrate.

[12] In the configuration recited in [11], the method may further include forming a second conductive layer having a first surface in contact with the first main surface before forming the via hole, wherein the via hole us formed such that the first surface is exposed in the via hole, and wherein the first conductive layer is formed such as to directly cover the first surface. This arrangement allows an electric potential to be applied to the second conductive layer through the first conductive layer.

[13] In the configuration recited in [12], the step of forming the first conductive layer may include: forming a first plating layer by electroplating at a first current density; and forming a second plating layer including dendrites on the first plating layer by electroplating at a second current density higher than the first current density. This arrangement allows the first conductive layer to easily have a thick portion covering the second conductive layer while allowing the first conductive layer to have dendrites. By forming the first conductive layer having a thick portion covering the second conductive layer, the stable supply of an electric potential to the second conductive layer through the first conductive layer is easily achieved.

[14] In the configuration recited in [12], the step of forming the first conductive layer may include: forming a second plating layer including dendrites by electroplating at a second current density; and forming a first plating layer on the second plating layer by electroplating at a first current density lower than the second current density. This arrangement also allows the first conductive layer to easily have a thick portion covering the second conductive layer while allowing the first conductive layer to have dendrites. By forming the first conductive layer having a thick portion covering the second conductive layer, the stable supply of an electric potential to the second conductive layer through the first conductive layer is easily achieved.

Details of Embodiments of Present Disclosure

In the following, embodiments of the present disclosure will be described in detail, but the present disclosure is not limited to these embodiments. In the specification and the drawings, elements having substantially the same functional configuration are denoted by the same reference numeral, and a duplicate description thereof may be omitted.

<Configuration of Semiconductor Device>

FIG. 1 is a cross-sectional view illustrating a semiconductor device according to an embodiment. As illustrated in FIG. 1, a semiconductor device 100 according to the embodiment mainly includes a substrate 10, a source electrode 31, a drain electrode 32, and a gate electrode 33.

The substrate 10 is an epitaxial substrate, and includes a silicon carbide (SiC) substrate 11 and a semiconductor layer 12. The semiconductor layer 12 is disposed on the silicon carbide substrate 11. The semiconductor layer 12 is, for example, a nitride semiconductor layer containing gallium (Ga). The nitride semiconductor layer constitutes part of a high electron mobility transistor (HEMT) 101 such as an electron transit layer (i.e., channel layer) and an electron supply layer (i.e., barrier layer). The substrate 10 has a first main surface 1 and a second main surface 2 opposite to the first main surface 1. The first main surface 1 is the upper surface of the substrate 10, and the second main surface 2 is the lower surface of the substrate 10. The silicon carbide substrate 11 forms the second main surface 2, and the semiconductor layer 12 forms the first main surface 1.

The source electrode 31, the drain electrode 32, and the gate electrode 33 are disposed on the semiconductor layer 12. The source electrode 31 and the drain electrode 32 include, for example, a tantalum (Ta) layer and an aluminum (Al) layer laminated in this order. The source electrode 31 and the drain electrode 32 are in ohmic contact with the semiconductor layer 12. The gate electrode 33 includes, for example, a nickel (Ni) layer, a palladium (Pd) layer, and a gold (Au) layer laminated in this order. The gate electrode 33 is in Schottky contact with the semiconductor layer 12.

An insulating film 41 is provided to cover the source electrode 31, the drain electrode 32, the gate electrode 33, and the semiconductor layer 12. The insulating film 41 is, for example, a silicon nitride (SiN) film.

A via hole 60 extending through the substrate 10 is formed in the substrate 10. The via hole 60 has an inner wall surface 61. The via hole 60 reaches the source electrode 31. The source electrode 31 has a first surface 34 that closes an end of the via hole 60. The first surface 34 may be referred to as a back surface of the via hole 60. The source electrode 31 is an example of the previously noted second conductive layer.

A first conductive layer 50 includes a plating base layer 51 and a plating layer 52. The plating base layer 51 directly covers the second main surface 2 of the substrate 10, the inner wall surface 61 of the via hole 60, and the first surface 34 of the source electrode 31 in the via hole 60. The plating layer 52 covers the plating base layer 51. The plating base layer 51 includes, for example, a nickel-chromium alloy (NiCr) layer and a gold (Au) layer laminated in this order. A copper layer may be used in place of the gold layer. The plating layer 52 covers the plating base layer 51. The material of the plating layer 52 is, for example, a material cheaper than gold. The plating layer 52 is, for example, a copper layer. The plating layer 52 includes dendrites, which provide large irregularities in the surface of the plating layer 52.

Figure 2:
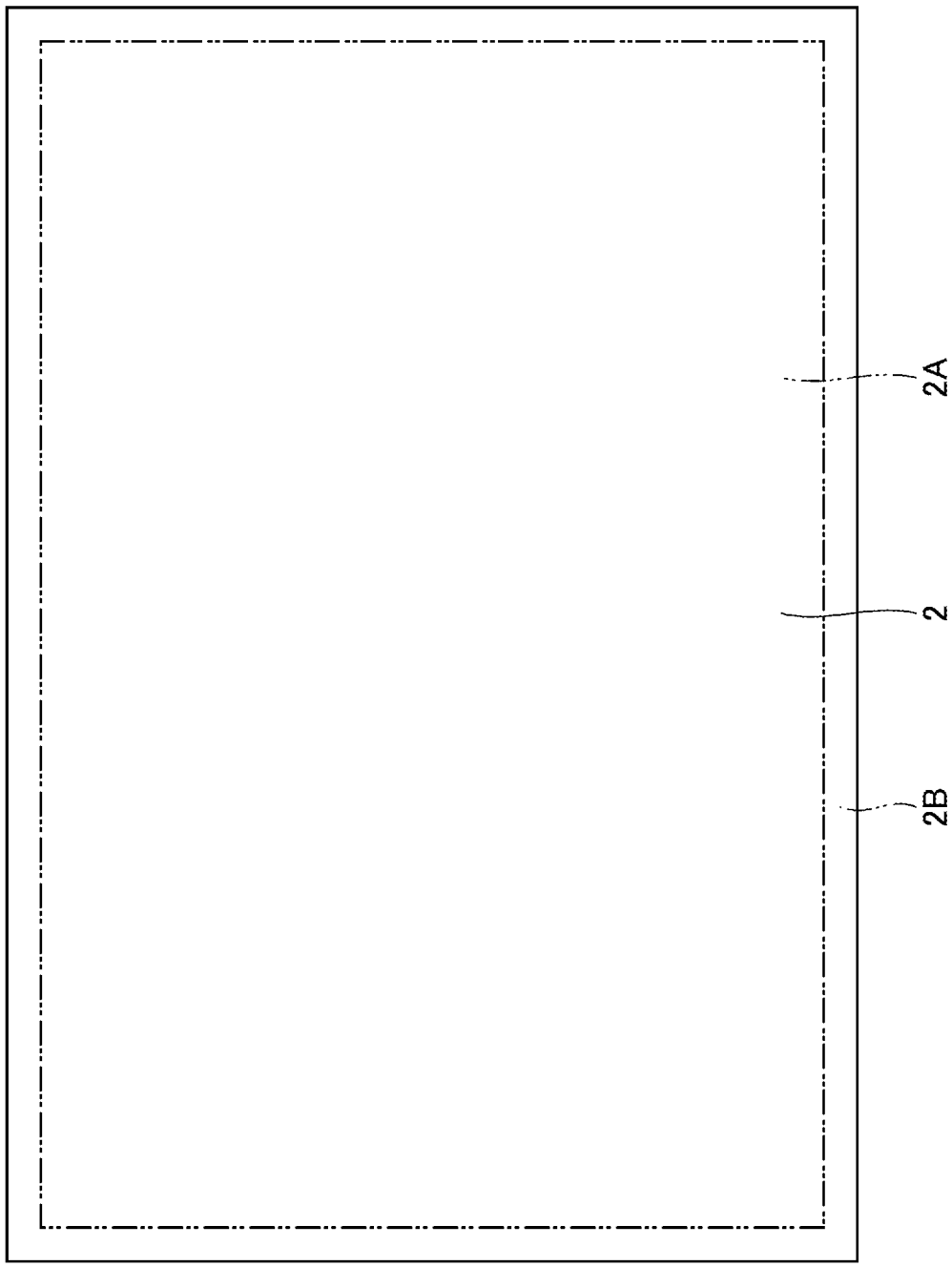
FIG. 2 is a view illustrating an outline of a second main surface of a substrate.

There will now be a detailed description of the first conductive layer 50. FIG. 2 is a drawing schematically illustrating the second main surface 2 of the substrate 10. As illustrated in FIG. 2, the outer shape of the second main surface 2 is, for example, rectangular. The second main surface 2 has a central region 2A and a peripheral region 2B. The shape of the central region 2A is mathematically similar to the outer shape of second main surface 2. The peripheral region 2B is provided around the central region 2A and has a constant width. The width of the peripheral region 2B is, for example, greater than or equal to 40 μm. The width of the peripheral region 2B may be 40 μm. As illustrated in FIG. 1, the first conductive layer 50 has a first portion 50A and a second portion 50B. The first portion 50A covers the first surface 34. The second portion 50B covers the second main surface 2 in the central region 2A.

The average thickness of the first portion 50A is, for example, greater than or equal to 0.2 μm. The average thickness of the first portion 50A is the mean value of the thicknesses of the first conductive layer 50 as measured in the direction perpendicular to the first surface 34.

The average thickness of the second portion 50B is greater than the average thickness of the first portion 50A, and is, for example, greater than or equal to 1.0 μm. The average thickness of the second portion 50B is the mean value of the thicknesses of the first conductive layer 50 as measured in the direction perpendicular to the second main surface 2.

The arithmetic average roughness Ra of the second portion 50B is, for example, greater than or equal to 1.5 μm. The arithmetic average roughness Ra of the second portion 50B is greater than the arithmetic average roughness Ra of the first portion and may be, for example, greater than equal to five times the arithmetic average roughness Ra of the first portion 50A.

<Example of Use of Semiconductor Device>

Figure 3:
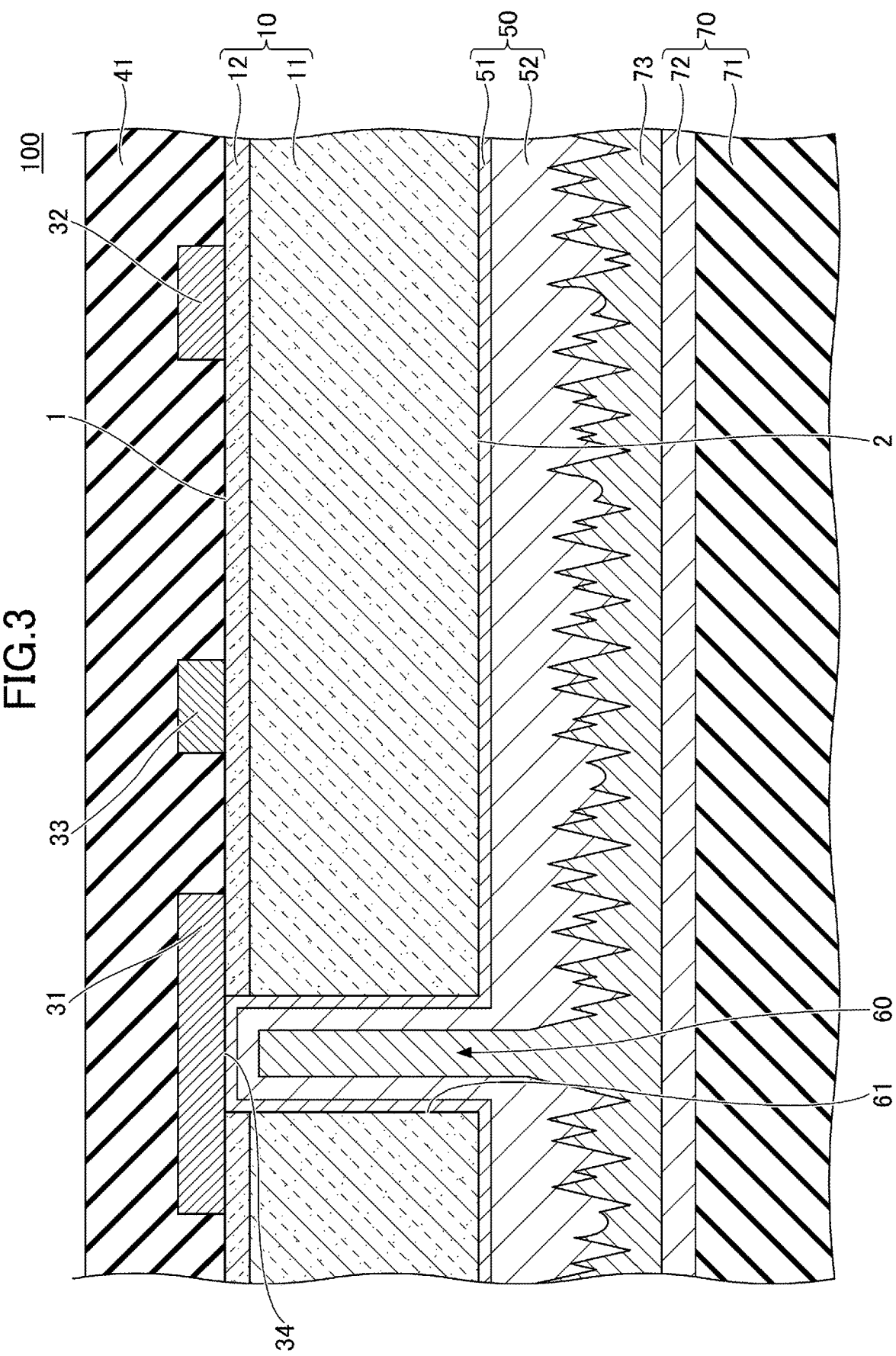
FIG. 3 is a cross-sectional view illustrating an example of use of the semiconductor device according to the embodiment.

In the following, an example of use of the semiconductor device 100 according to the embodiment will be described. FIG. 3 is a cross-sectional view illustrating an example of use of the semiconductor device 100 according to the embodiment.

As illustrated in FIG. 3, the semiconductor device 100 when used is mounted on a mounting substrate 70. The mounting substrate 70 includes a base 71 and a third conductive layer 72 disposed on the base 71. The first conductive layer 50 is bonded to the third conductive layer 72 via a bonding material 73. The bonding material 73 contains, for example, silver. The bonding material 73 is also present in the via hole 60. The bonding material 73 is in contact with both the surface of the first conductive layer 50 facing the third conductive layer 72 and the surface of the third conductive layer 72 facing the first conductive layer 50.

An electric potential such as a ground potential is applied to the third conductive layer 72. This potential is applied to the source electrode 31 through the bonding material 73 and the first conductive layer 50. In this manner, the potential of the third conductive layer 72 is applied to the source electrode 31.

In the present embodiment, the first conductive layer 50 covers the second main surface 2, and includes dendrites. As a result, the first conductive layer 50 has a large contact area with the bonding material 73 when attached to the mounting substrate 70. Heat is thus easily transferred from the first conductive layer 50 to the bonding material 73. Even when a material such as copper that is less expensive than gold is used for the plating layer 52 to reduce the material cost, it is possible to reduce the decrease of heat dissipation.

Further, since a large contact area is secured between the first conductive layer 50 and the bonding material 73, excellent bonding strength is provided between the first conductive layer 50 and the mounting substrate 70. That is, an anchor effect is created to provide excellent bonding strength.

Covering the first surface 34 of the source electrode 31 directly with the first conductive layer 50 enables an electric potential to be applied to the source electrode 31 through the first conductive layer 50.

Provision of the first portion 50A having an average thickness greater than or equal to 0.2 μm enables more stable supply of an electric potential to the source electrode 31 through the first conductive layer 50. The average thickness of the first portion 50A is preferably greater than or equal to 0.5 μm, and more preferably greater than or equal to 1.0 μm.

Provision of the second portion 50B having an average thickness greater than the average thickness of the first portion 50A readily enables stable supply of an electric potential to the source electrode 31. In order to secure the stable supply of an electric potential to the source electrode 31 through the first conductive layer 50, that portion of the first conductive layer 50 which covers the second main surface 2 is preferably thicker than the first portion 50A. However, even when the portion of the first conductive layer 50 covering the second main surface 2 is thicker than the first portion 50A, it may be difficult to ensure the stably supply of an electric potential if the first conductive layer 50 is thick only in the peripheral region 2B and thin in the central region 2A.

Provision of the arithmetic average roughness Ra of the second portion 50B greater than or equal to 1.5 μm readily enables the reduction of decrease of heat dissipation, and readily enables the obtainment of excellent bonding strength between the first conductive layer 50 and the mounting substrate 70. The arithmetic average roughness Ra of the second portion 50B is preferably greater than or equal to 2.0 μm, and more preferably greater than or equal to 3.0 μm.

Provision of the arithmetic average roughness Ra of the second portion 50B greater than or equal to five times the arithmetic average roughness Ra of the first portion 50A readily enables the reduction of decrease of heat dissipation, and also readily enables the obtainment of excellent bonding strength between the first conductive layer 50 and the mounting substrate 70. The arithmetic average roughness Ra of the second portion 50B is preferably greater than or equal to 7 times the arithmetic average roughness Ra of the first portion 50A, and more preferably greater than or equal to 10 times the arithmetic average roughness Ra of the first portion 50A.

In the HEMT 101 including the source electrode 31, an electric potential such as a ground potential can be applied to the source electrode 31 through the first conductive layer 50. Although the source electrode 31 is an example of the second conductive layer in the present embodiment, the source electrode 31 may be provided apart from the second conductive layer, and the source electrode 31 may be electrically connected to the second conductive layer.

When the first conductive layer 50 contains copper, the material cost can be easily reduced.

Use of the substrate 10 including the silicon carbide substrate 11 and the semiconductor layer 12 readily enables the obtainment of excellent breakdown voltage. Such a semiconductor device 100 may be used for applications requiring a high breakdown voltage, for example.

First Example of Method of Making Semiconductor Device

In the following, a first example of a method of making the semiconductor device 100 according to the embodiment will be described. FIGS. 4 to 10 are cross-sectional views illustrating the first example of a method of making the semiconductor device 100 according to the embodiment.

Figure 4:
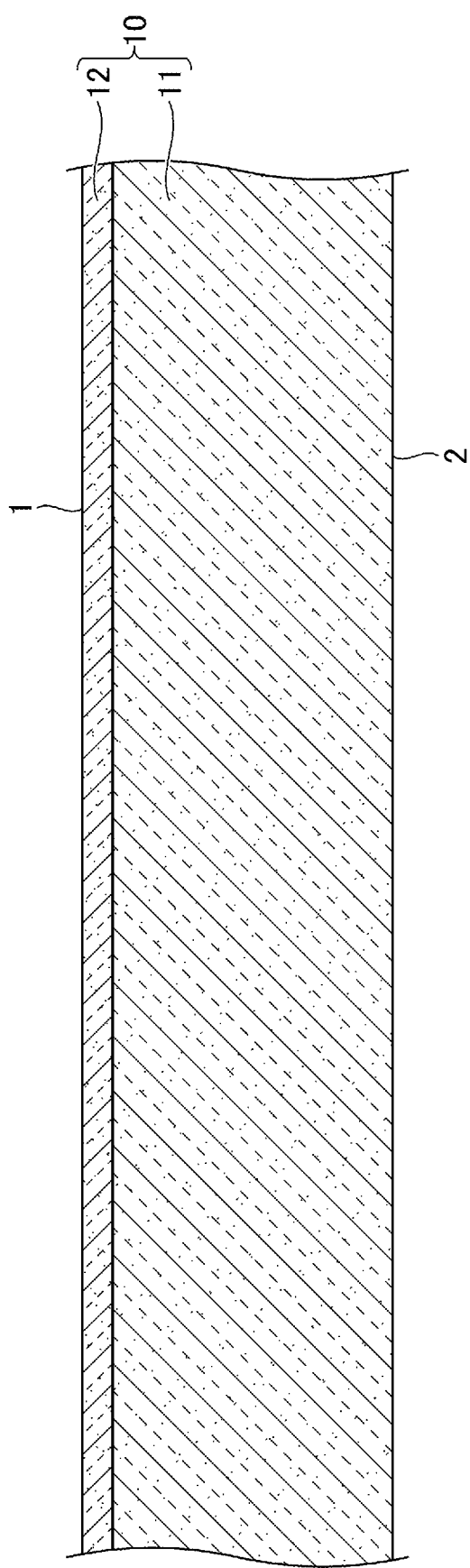
FIG. 4 is a cross-sectional view (part 1) illustrating a first example of a method of making the semiconductor device according to the embodiment.

In the first example, as illustrated in FIG. 4, a semiconductor layer 12 is formed on a silicon carbide substrate 11 by, for example, a metal organic chemical vapor deposition (MOCVD) method. This arrangement enables the obtainment of the substrate that is an epitaxial substrate.

Figure 5:
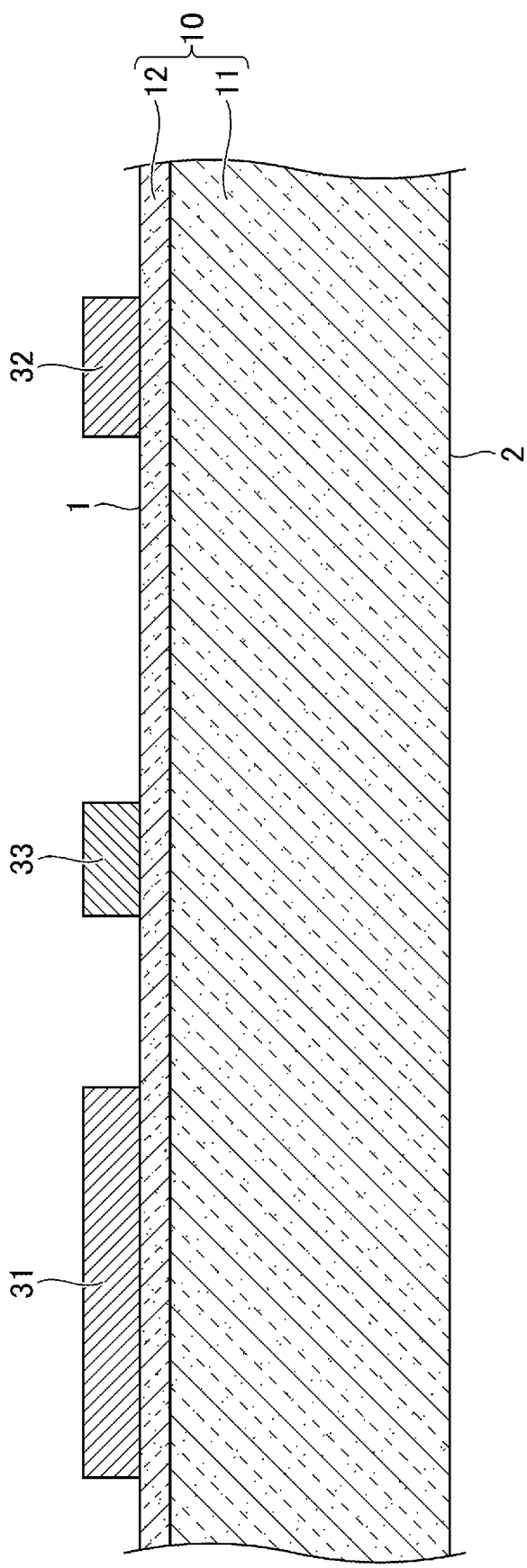
FIG. 5 is a cross-sectional view (part 2) illustrating the first example of the method of making the semiconductor device according to the embodiment.

As illustrated in FIG. 5, a source electrode 31, a drain electrode 32, and a gate electrode 33 are formed on the semiconductor layer 12.

Figure 6:
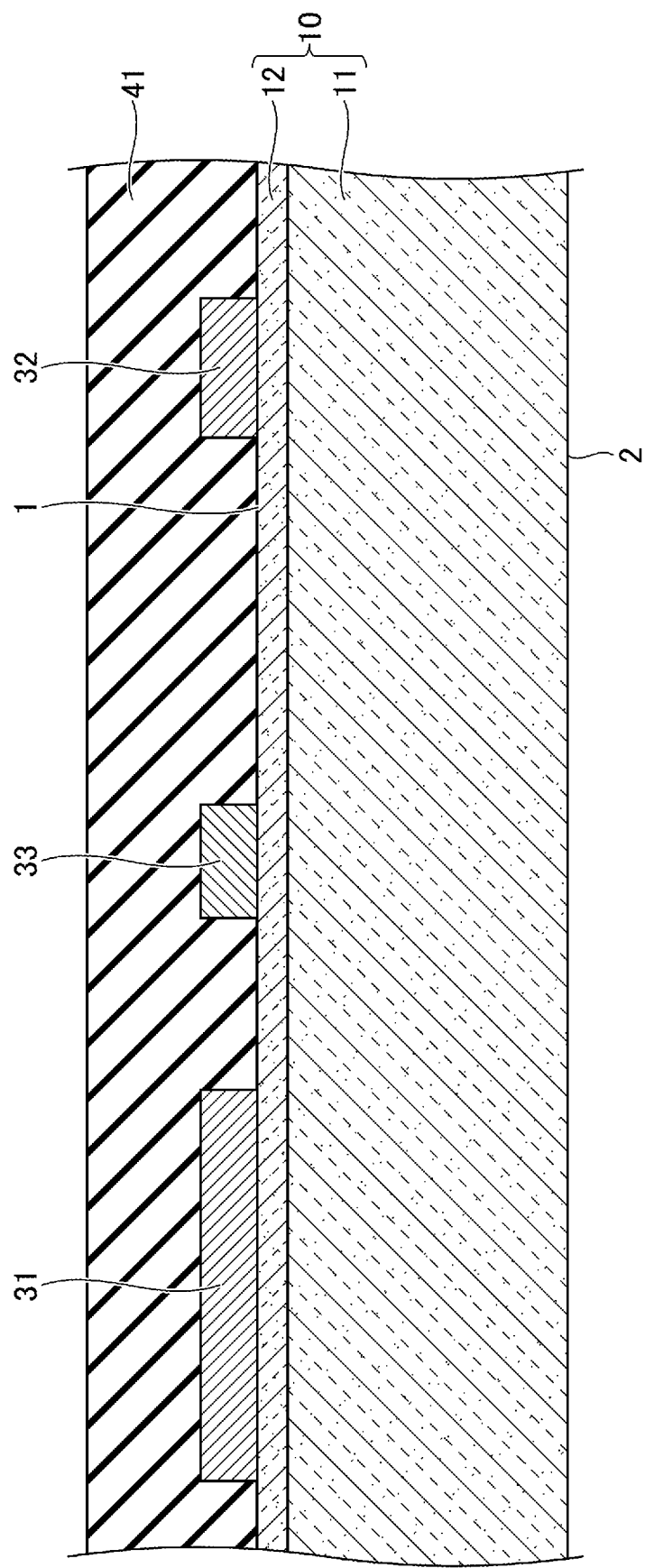
FIG. 6 is a cross-sectional view (part 3) illustrating the first example of the method of making the semiconductor device according to the embodiment.

As illustrated in FIG. 6, an insulating film 41 covering the source electrode 31, the drain electrode 32, the gate electrode 33, and the semiconductor layer 12 is formed.

Figure 7:
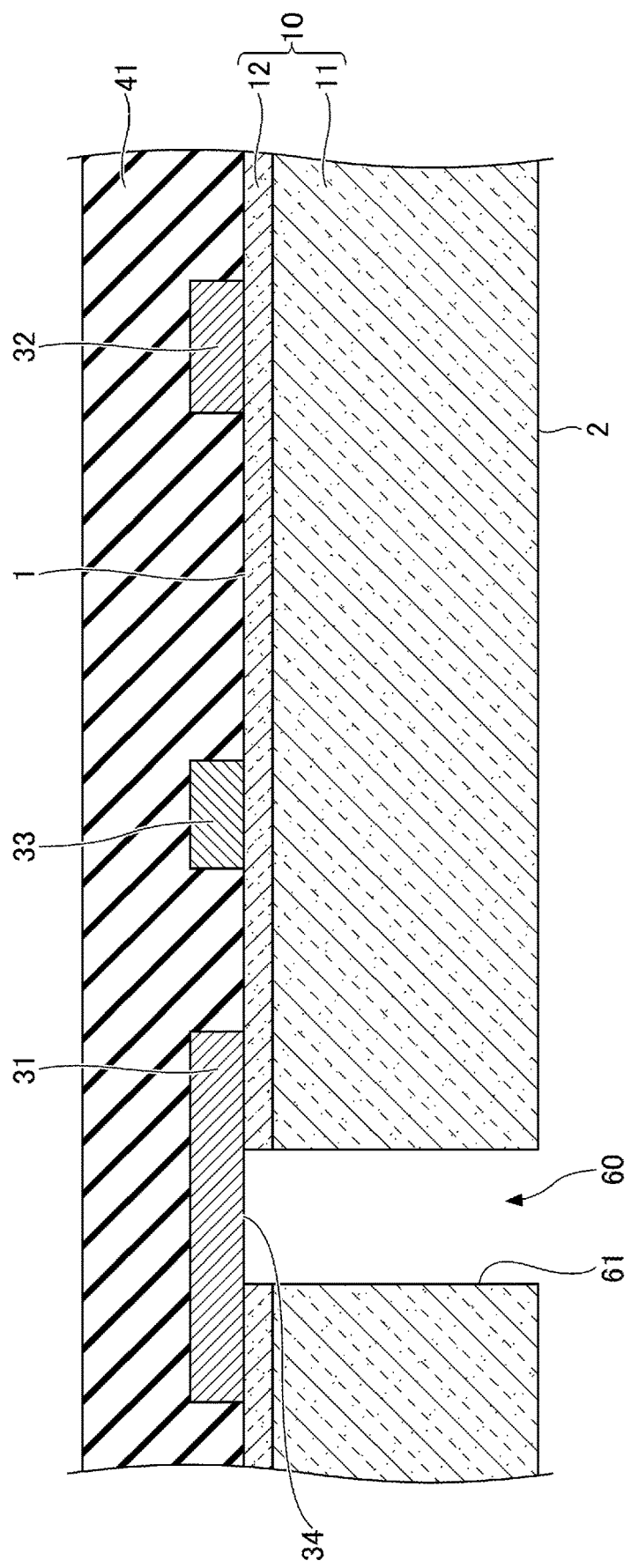
FIG. 7 is a cross-sectional view (part 4) illustrating the first example of the method of making the semiconductor device according to the embodiment.

As illustrated in FIG. 7, a via hole 60 extending through the substrate 10 is formed in the substrate 10. The via hole 60 has an inner wall surface 61. The via hole 60 is formed such as to reach the source electrode 31. The first surface 34 of the source electrode 31 is exposed in the via hole 60. The first surface 34 may be referred to as a back surface of the via hole 60.

Figure 8:
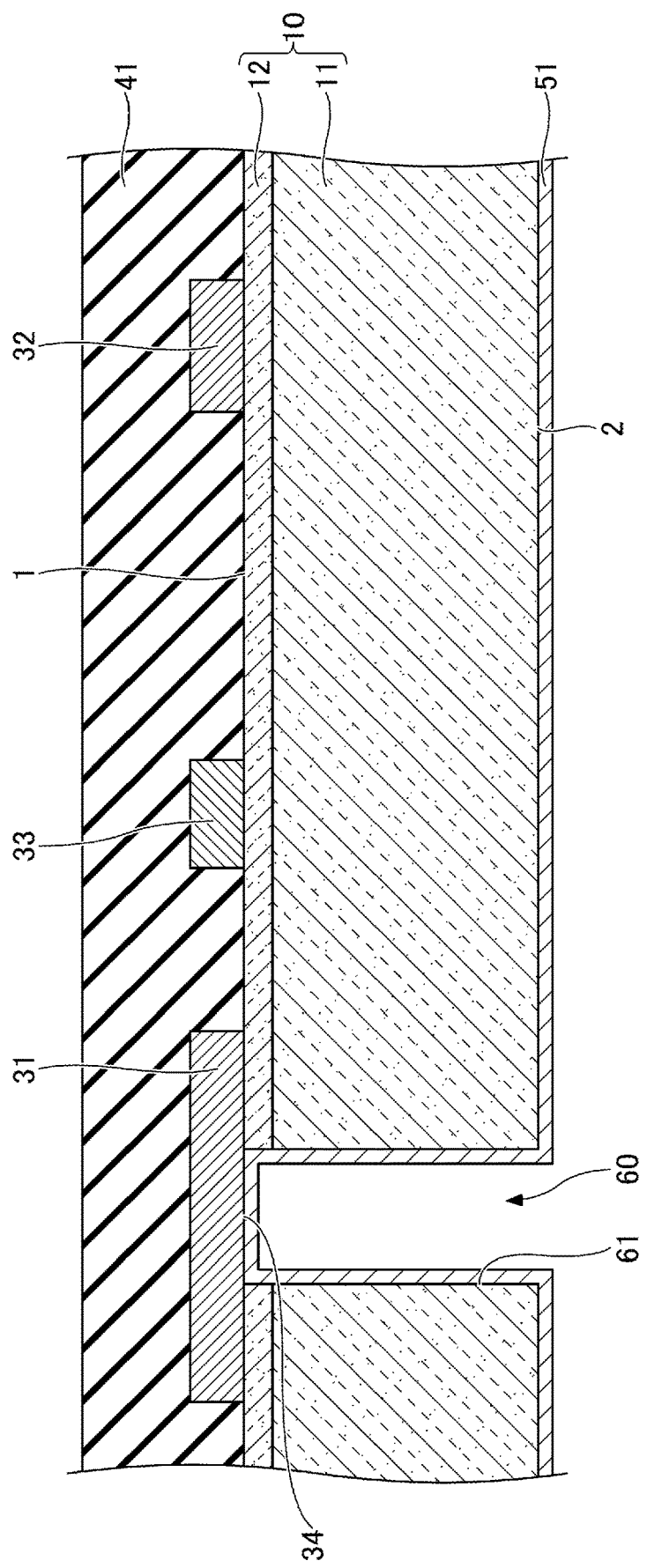
FIG. 8 is a cross-sectional view (part 5) illustrating the first example of the method of making the semiconductor device according to the embodiment.

As illustrated in FIG. 8, a plating base layer 51 is formed to cover the second main surface 2 of the substrate 10, the inner wall surface 61 of the via hole 60, and the first surface 34 of the source electrode 31 exposed in the via hole 60. In forming the plating base layer 51, a nickel-chromium alloy layer and a gold layer are laminated in this order by sputtering, for example. In place of the gold layer, a copper layer may alternatively be formed.

Figure 9:
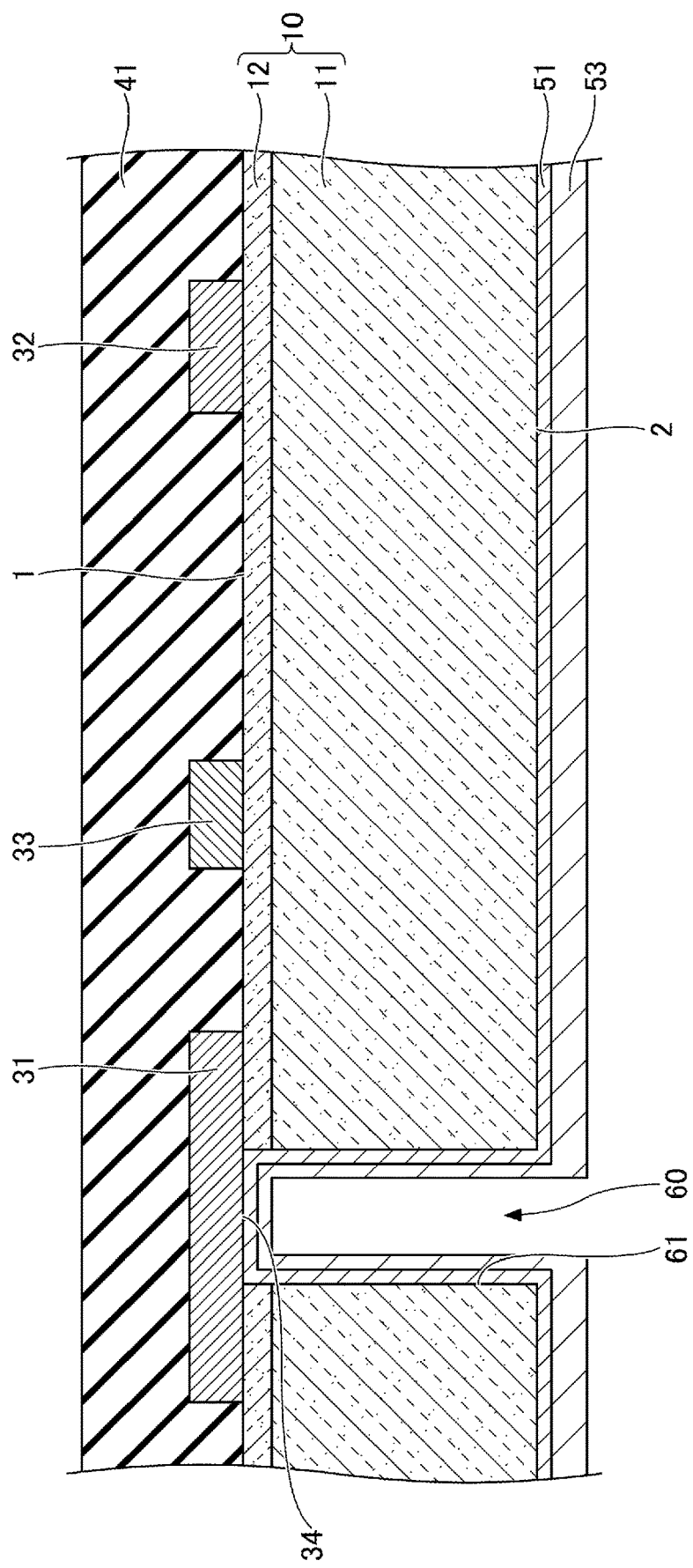
FIG. 9 is a cross-sectional view (part 6) illustrating the first example of the method of making the semiconductor device according to the embodiment.

As illustrated in FIG. 9, a first plating layer 53 covering the plating base layer 51 is formed by electroplating. The first plating layer 53 is formed under such conditions that the arithmetic average roughness Ra thereof is relatively small. The material of the first plating layer 53 is, for example, a material cheaper than gold. The first plating layer 53 is, for example, a copper layer.

Figure 10:
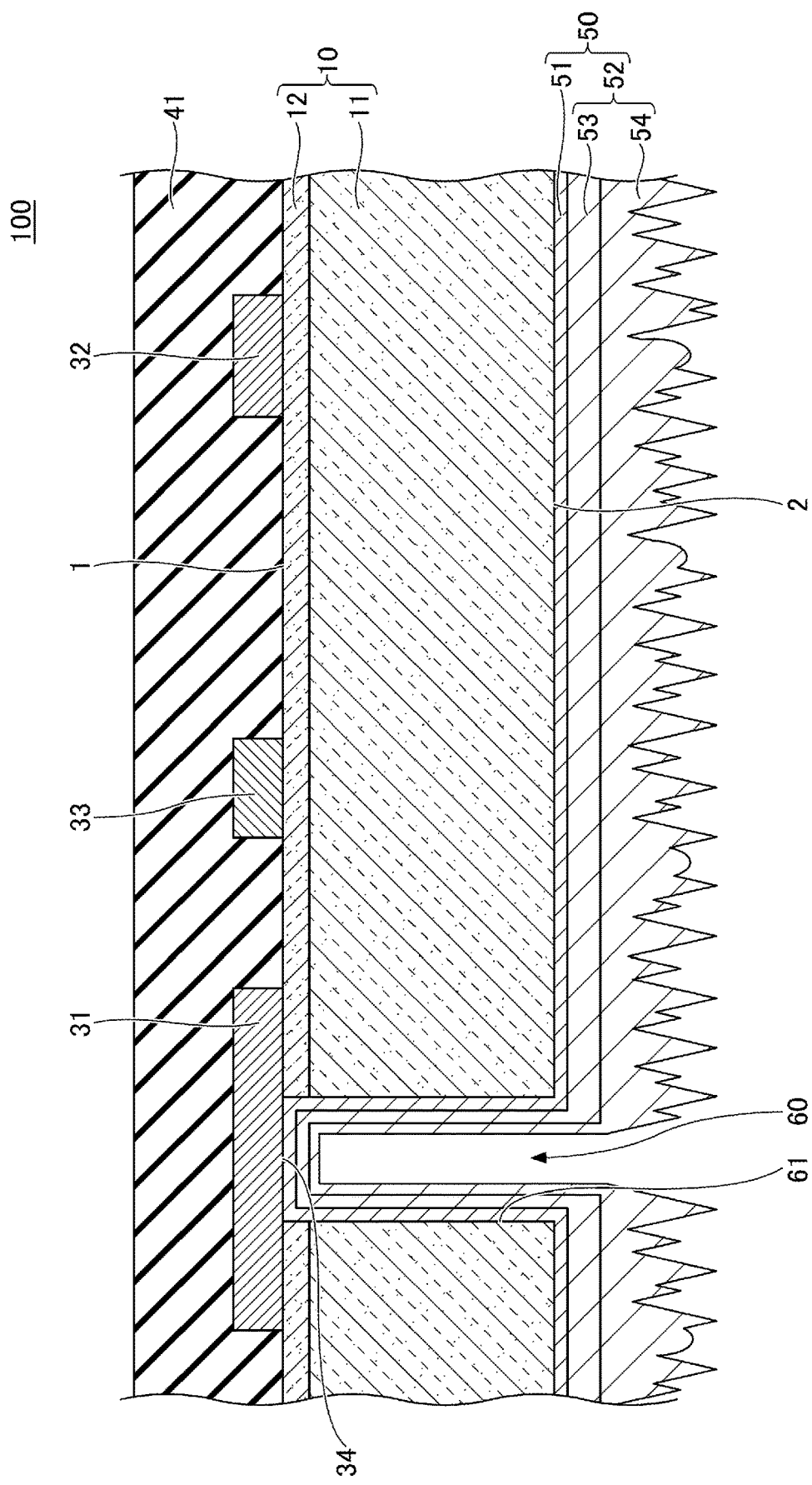
FIG. 10 is a cross-sectional view (part 7) illustrating the first example of the method of making the semiconductor device according to the embodiment.

As illustrated in FIG. 10, a second plating layer 54 is formed on the first plating layer 53 by electroplating, thereby forming the plating layer 52 including the first plating layer 53 and the second plating layer 54. The material of the second plating layer 54 is, for example, a material cheaper than gold. The second plating layer 54 is, for example, a copper layer. The second plating layer 54 is formed to include dendrites. The second plating layer 54 is formed under such conditions that the arithmetic average roughness Ra thereof is larger than the arithmetic average roughness Ra of the first plating layer 53. For example, a second current density used to form the second plating layer 54 is set higher than a first current density used to form the first plating layer 53. In electroplating, the higher the current density, the higher the plating rate at a portion close to the counter electrode, and the lower the plating rate at a portion far from the counter electrode. As a result, deposition of the second plating layer 54 on the portion covering the second main surface 2 of the substrate 10 is locally facilitated, whereas deposition inside the via hole 60 less readily occurs. As a result, the second plating layer 54 including dendrites is formed as desired.

The steps described above enable the manufacturing of the semiconductor device 100 according to the embodiment.

According to the first example, the first portion 50A of the first conductive layer 50 is readily made thick while causing the first conductive layer 50 to include dendrites. Provision of the thick first portion 50A readily enables the stable supply of an electric potential to the source electrode 31 through the first conductive layer 50.

Second Example of Method of Making Semiconductor Device

Figure 11:
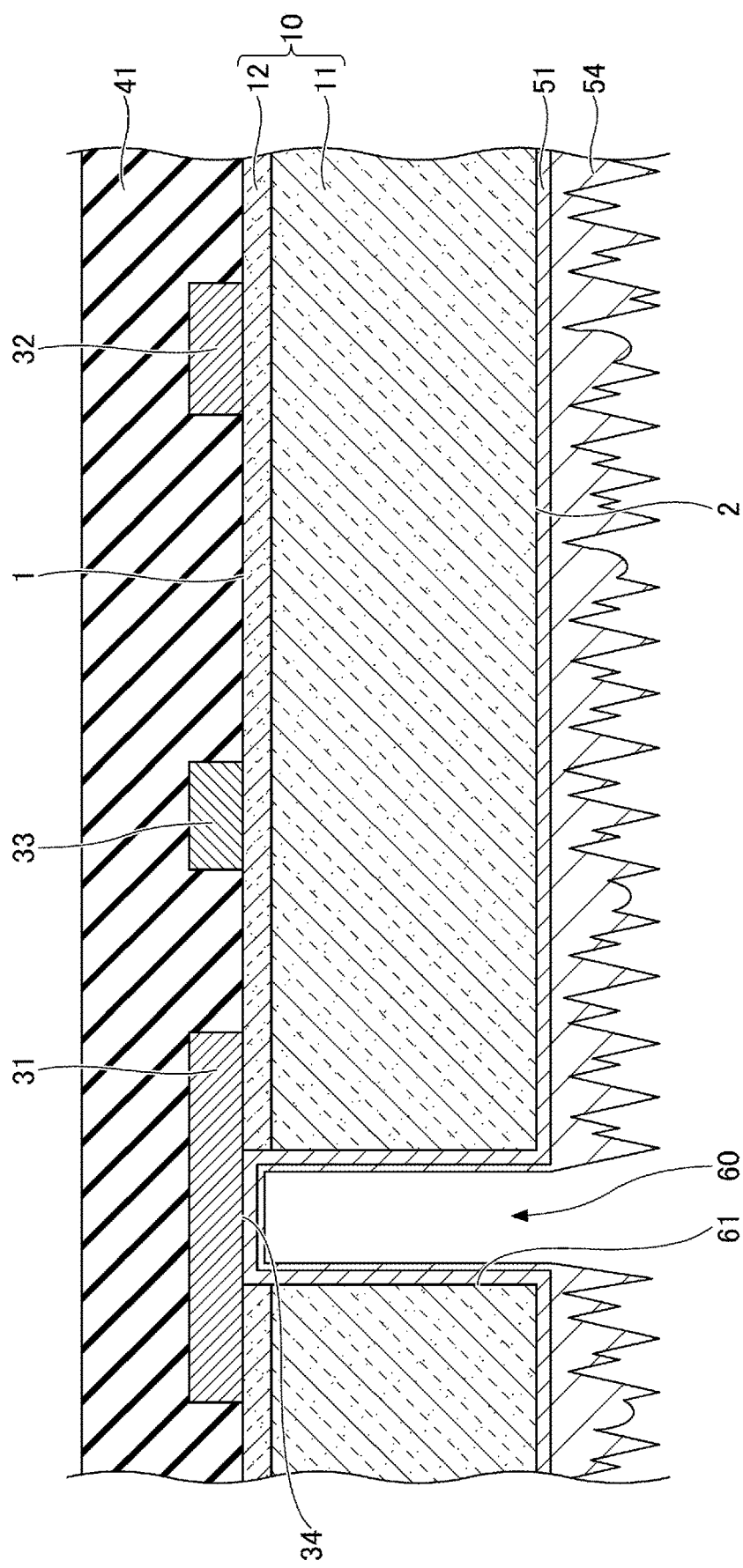
FIG. 11 is a cross-sectional view (part 1) illustrating a second example of a method of making the semiconductor device according to the embodiment.
Figure 12:
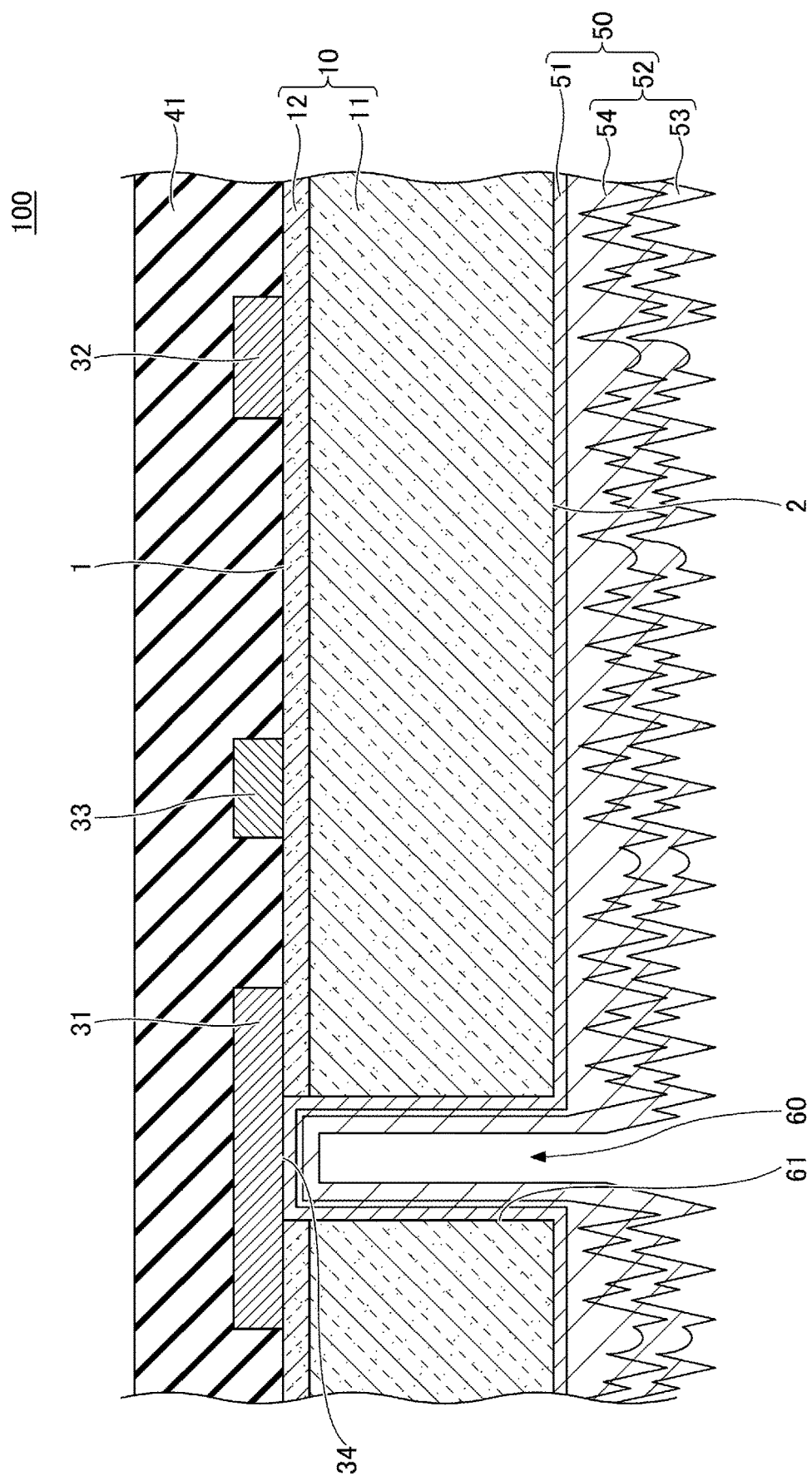
FIG. 12 is a cross-sectional view (part 2) illustrating the second example of the method of making the semiconductor device according to the embodiment.

In the following, a second example of the method of making the semiconductor device 100 according to the embodiment will be described. FIGS. 11 and 12 are cross-sectional views illustrating a second example of the method of making the semiconductor device 100 according to the embodiment.

In the second example, the processes up to the formation of the plating base layer 51 are performed in the same manner as in the first example (see FIG. 8). Thereafter, as illustrated in FIG. 11, a second plating layer 54 covering the plating base layer 51 is formed by electroplating. The material of the second plating layer 54 is, for example, a material cheaper than gold. The second plating layer 54 is, for example, a copper layer. The second plating layer 54 is formed such as to include dendrites. The second plating layer 54 is formed under such conditions that the arithmetic average roughness Ra thereof becomes relatively large.

As illustrated in FIG. 12, a first plating layer 53 is then formed on the second plating layer 54 by electroplating, thereby forming the plating layer 52 including the first plating layer 53 and the second plating layer 54. The material of the first plating layer 53 is, for example, a material cheaper than gold. The first plating layer 53 is, for example, a copper layer. The first plating layer 53 is formed under such conditions that variation in the thickness of the first plating layer 53 is smaller than variation in the thickness of the second plating layer 54. For example, a first current density used to form the first plating layer 53 is set lower than a second current density used to form the second plating layer 54.

The steps described above enable the manufacturing of the semiconductor device 100 according to the embodiment.

According to the second example, the first portion 50A of the first conductive layer 50 is easily made thick while causing the first conductive layer to include dendrites. Provision of the thick first portion 50A readily enables the stably supply of an electric potential to the source electrode 31 through the first conductive layer 50.

It may be noted that the arithmetic average roughness may be measured using an atomic force microscope (AFM).

Although the embodiment has heretofore been described in detail, the invention is not limited to a particular embodiment, and various variations and modifications can be made within the scope described in the claims.

What is claimed is:

1. A semiconductor device comprising:
    a substrate having a first main surface and a second main surface opposite to the first main surface; and
    a first conductive layer covering the second main surface and including dendrites,
    wherein a via hole extending through the substrate and having an inner wall surface is formed in the substrate, and
    wherein the first conductive layer covers the inner wall surface.

2. The semiconductor device as claimed in claim 1, further comprising a second conductive layer disposed on the first main surface and having a first surface that closes an end of the via hole;
    wherein the first conductive layer directly covers the first surface.

3. The semiconductor device as claimed in claim 2, wherein an average thickness of a first portion of the first conductive layer, the first portion covering the first surface, is greater than or equal to 0.2 µm.

4. The semiconductor device as claimed in claim 3, wherein the second main surface includes:
    a central region; and
    a closed-loop peripheral region situated around the central region and having a constant width,
    wherein the width of the closed-loop peripheral region is less than or equal to 40 µm, and
    wherein an average thickness of a second portion of the first conductive layer, the second portion covering the second main surface in the central region, is greater than the average thickness of the first portion.

5. The semiconductor device as claimed in claim 4, wherein an arithmetic average roughness of the second portion is greater than or equal to 1.5 µm.

6. The semiconductor device as claimed in claim 4, wherein an arithmetic average roughness of the second portion is greater than or equal to five times an arithmetic average roughness of the first portion.

7. The semiconductor device as claimed in claim 2, further comprising a transistor including a source electrode connected to the second conductive layer.

8. The semiconductor device as claimed in claim 1, wherein the first conductive layer contains copper.

9. The semiconductor device as claimed in claim 1, wherein the substrate includes:
    a silicon carbide substrate forming the second main surface; and
    a semiconductor layer disposed on the silicon carbide substrate and forming the first main surface.

10. The semiconductor device as claimed in claim 1, further comprising:
    a mounting substrate including a third conductive layer; and
    a bonding material that bonds the first conductive layer to the third conductive layer.

11. A method of making a semiconductor device, comprising:
    forming, in a substrate having a first main surface and a second main surface opposite to the first main surface, a via hole extending through the substrate and having an inner wall surface; and
    forming a first conductive layer covering the second main surface and the inner wall surface, the first conductive layer including dendrites.

12. The method of making a semiconductor device as claimed in claim 11, further comprising forming a second conductive layer having a first surface in contact with the first main surface before the forming of the via hole
    wherein the via hole is formed such that the first surface is exposed in the via hole, and
    wherein the first conductive layer is formed such as to directly cover the first surface.

13. The method of making a semiconductor device as claimed in claim 12, wherein the forming the first conductive layer includes:
    forming a first plating layer by electroplating at a first current density; and
    forming a second plating layer including dendrites on the first plating layer by electroplating at a second current density higher than the first current density.

14. The method of making a semiconductor device as claimed in claim 12, wherein the forming the first conductive layer includes:
    forming a second plating layer including dendrites by electroplating at a second current density; and
    forming a first plating layer on the second plating layer by electroplating at a first current density lower than the second current density.

* * * * *